United States Patent [19]

Gerlach et al.

[11] 4,412,771
[45] Nov. 1, 1983

[54] SAMPLE TRANSPORT SYSTEM

[75] Inventors: Robert L. Gerlach, Minnetonka; David D. Seibel, Lakeville; Mark C. Miller, Chanhassen, all of Minn.

[73] Assignee: The Perkin-Elmer Corporation, Norwalk, Conn.

[21] Appl. No.: 288,439

[22] Filed: Jul. 30, 1981

[51] Int. Cl.$^3$ .............................................. B65G 51/02
[52] U.S. Cl. .................................. 414/217; 414/222; 414/417; 414/331; 118/729
[58] Field of Search ............. 414/217, 222, 225, 226, 414/403, 416, 417, 331; 118/50, 719, 728, 729, 730, 733, 500; 294/106, 113

[56] References Cited

U.S. PATENT DOCUMENTS

| 3,516,386 | 6/1970 | Landwear et al. | 118/730 |
| 3,584,847 | 6/1971 | Hammond et al. | 118/719 |
| 3,585,941 | 6/1971 | Primo | 104/173 R |
| 3,902,615 | 9/1975 | Levy et al. | 414/331 |
| 3,981,791 | 9/1976 | Rosvold | 118/50 |
| 4,089,735 | 5/1978 | Sussmann | 118/729 |
| 4,293,249 | 3/1982 | Whelan | 414/217 |
| 4,318,767 | 10/1981 | Hijikata et al. | 414/225 |

FOREIGN PATENT DOCUMENTS 2047537 9/1970 Fed. Rep. of Germany ...... 414/223

*Primary Examiner*—Robert B. Reeves
*Assistant Examiner*—James Barlow
*Attorney, Agent, or Firm*—S. A. Giarratana; F. L. Masselle; R. A. Hays

[57] ABSTRACT

A sample transport system adaptable for use in an MBE instrument includes means for introducing a plurality of substrates into a storage chamber and means for conveying each substrate on a preselected basis to a processing chamber whereby the wafers not being processed are completely protected against contaminants which may occur within the processing chamber.

19 Claims, 12 Drawing Figures

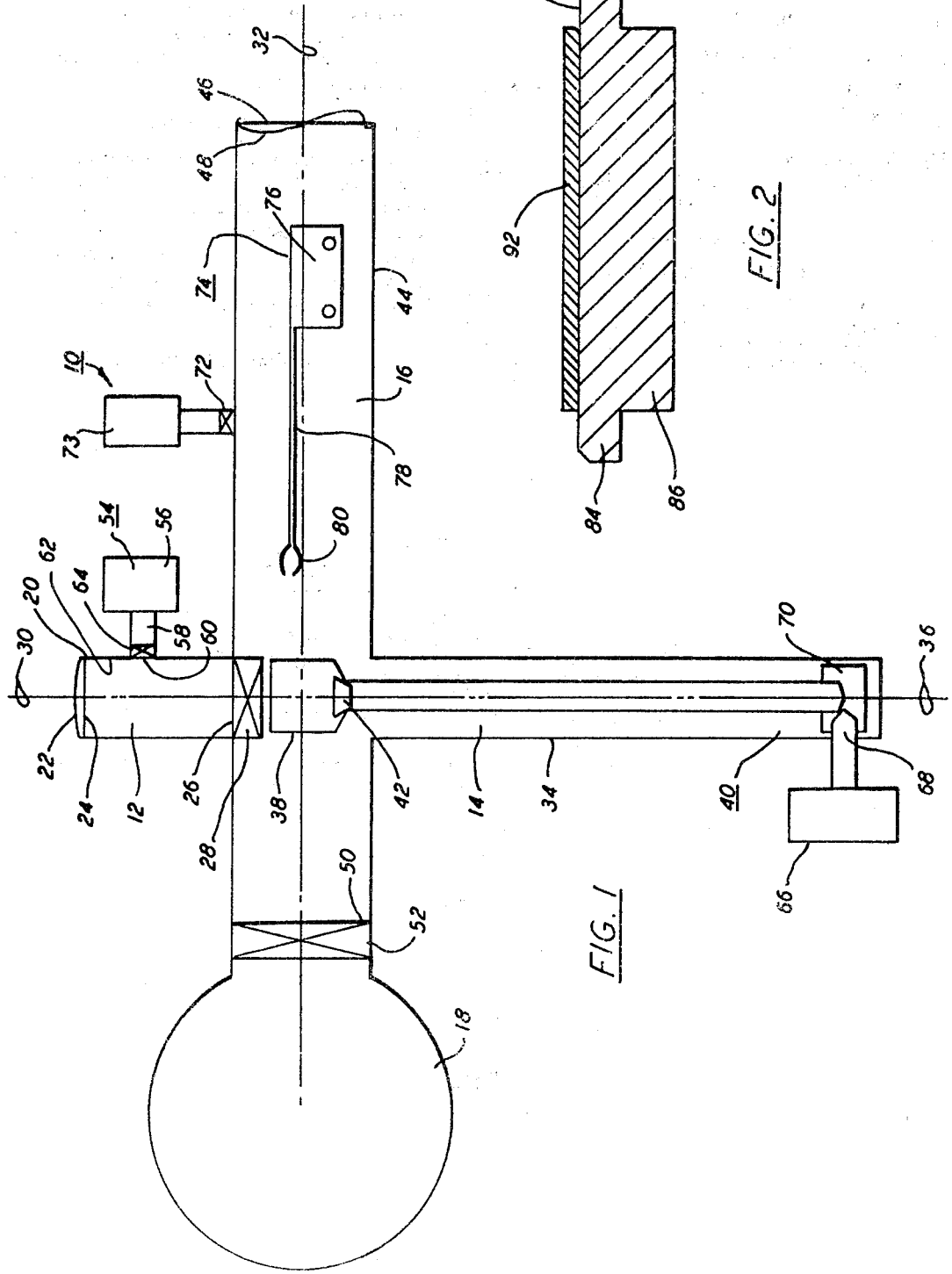

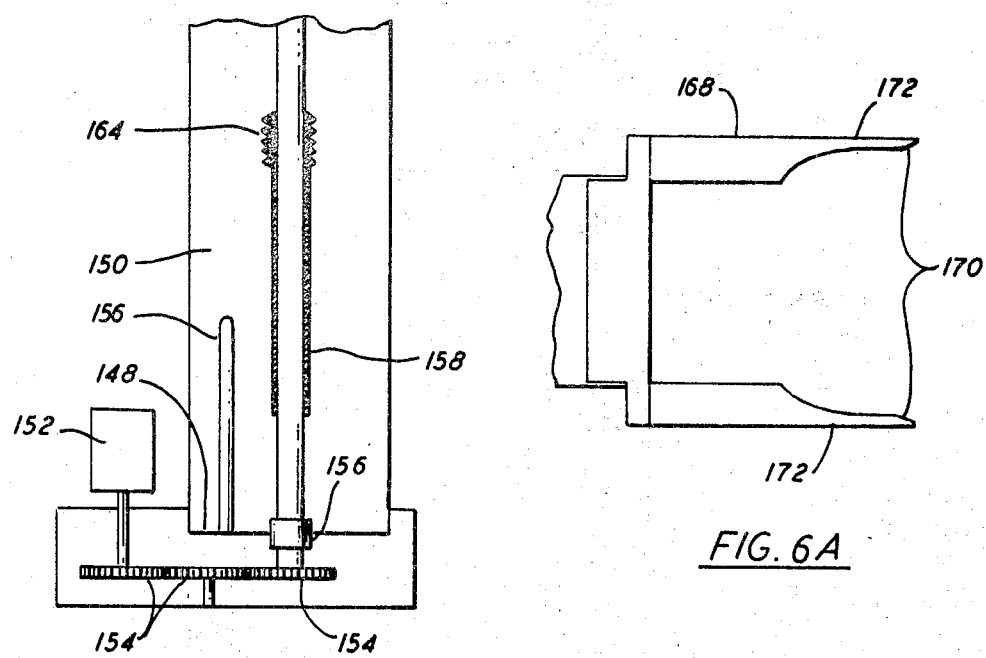
FIG. 5
FIG. 6A
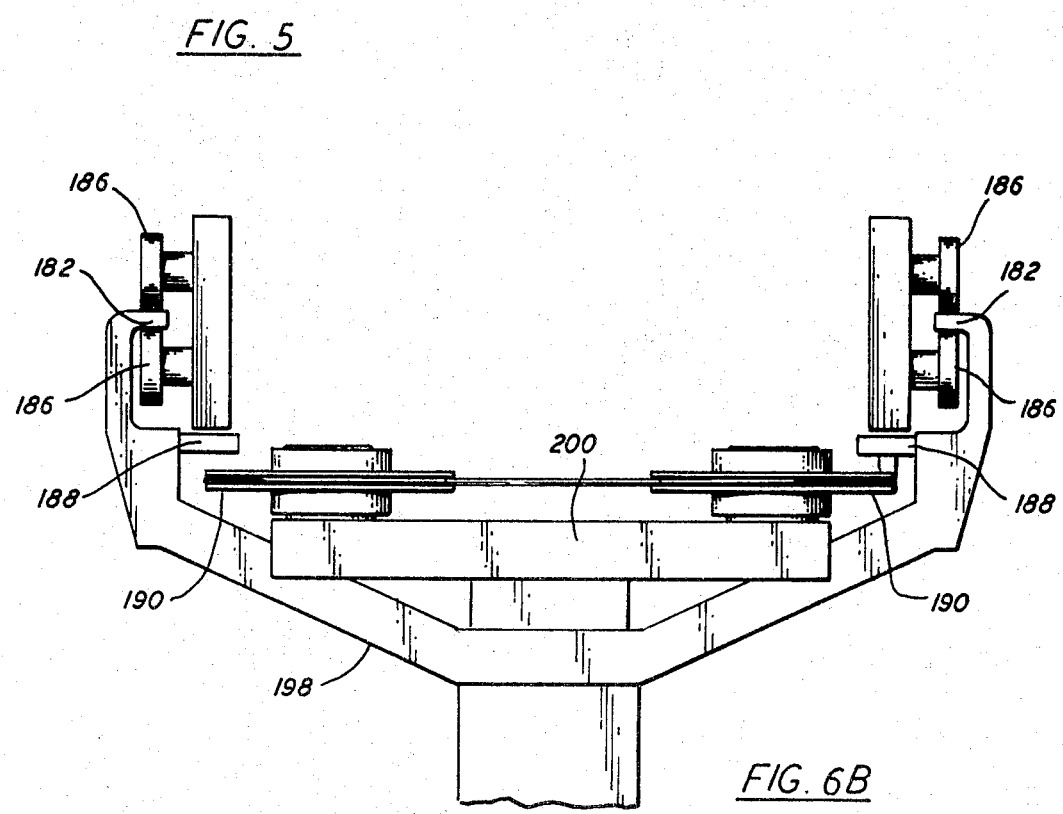
FIG. 6B

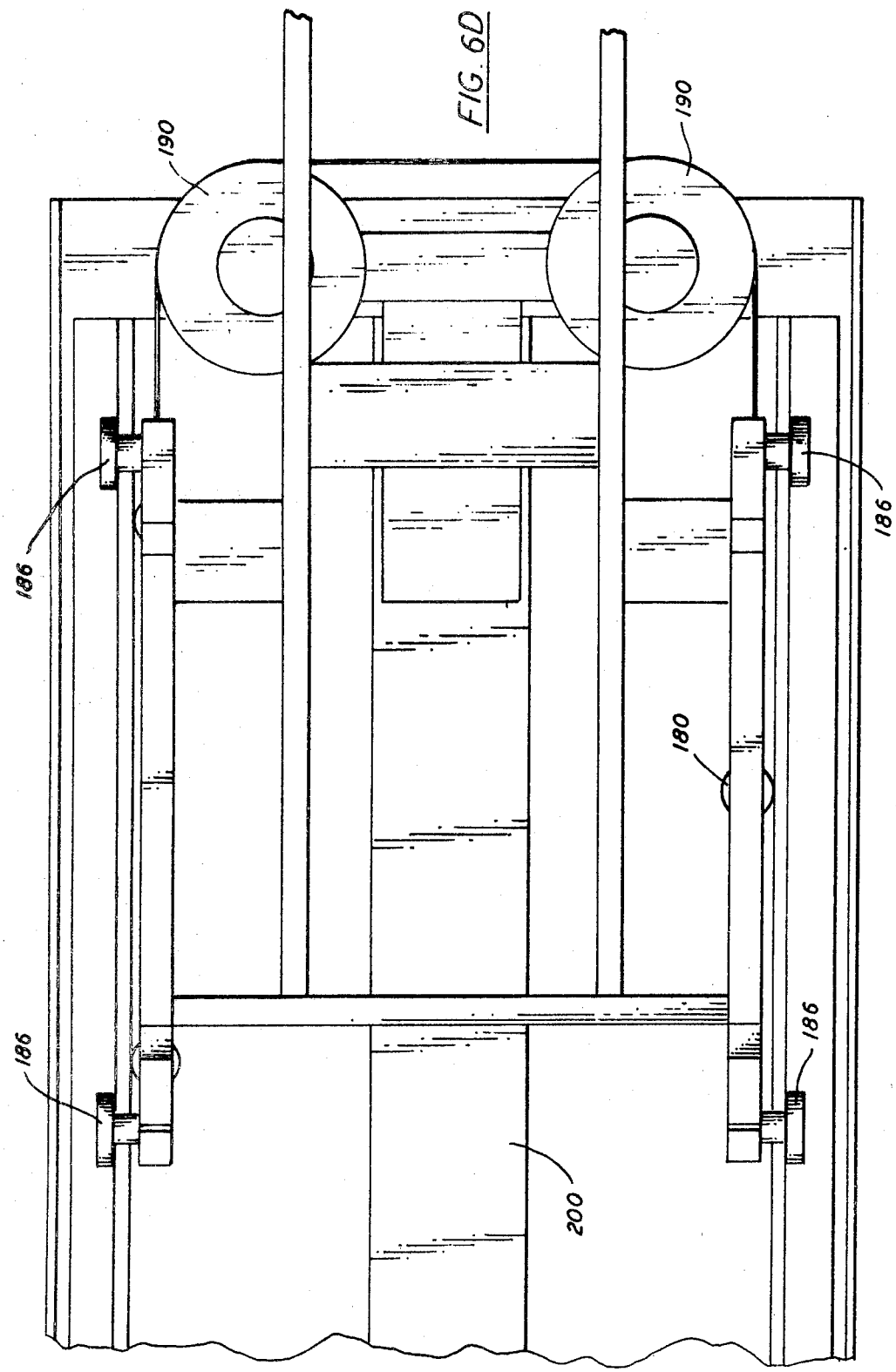

SAMPLE TRANSPORT SYSTEM

BACKGROUND OF THE INVENTION

The present invention generally relates to a multiple sample transport system and, in particular, relates to such a system useful in an apparatus operating under an ultra-high vacuum.

The formation of semiconductor layers on a substrate by use of one or more high temperature molecular beams in a ultra-high vacuum ambient is generally referred to as molecular beam epitaxy (MBE). The significance of MBE is difficult to overstate in the semiconductor manufacturing art since, by use of multiple beams having different impurity contents, the achievable doping profile is extremely controllable and adaptable to the desires of the manufacturer. As such, the resultant semiconductor devices have operating parameters more closely related to the ideal, or theoretical, values than do devices manufactured by the more conventional techniques. Nevertheless, the use of MBE as a viable manufacturing technique is still in its infancy and is on the verge of emerging from the laboratory model to a large scale manufacturing instrument.

As with most scientific advances, the conversion of an apparatus from a laboratory model to a manufacturing model is extremely difficult, time consuming and presents numerous problems. One particular problem in developing a commercial MBE system is that, while in the laboratory, the length of time necessary to process a workpiece, i.e. generally a semiconductor wafer, was a minor consideration; however, such processing times are a major consideration in commercial endeavors. Thus, an apparatus which individually introduces a single workpiece into the vacuum system of an MBE for processing and then removes that workpiece before another can be introduced is quite unacceptable for commercial purposes. This is particularly so, since each time the ultra-high vacuum of the system is broken, a considerable period of time is necessary to re-establish that vacuum.

One solution to this difficulty has been to process a plurality of workpieces simultaneously and thereby reduce the turnaround time. Such a mechanism is described in U.S. Pat. No. 4,137,865 issued on Feb. 6, 1979 to Alfred Y. Cho and assigned to Bell Telephone Laboratories, Inc. Therein, a molecular beam epitaxial apparatus is described wherein a plurality of substrates are conveyed into the growth chamber of the MBE system and, once in the growth chamber, each substrate is individually processed. Such an apparatus must include means within the growth chamber for reducing cross-contamination between the wafers therein. Nevertheless, it is inevitable that some degree of cross-contamination will occur since the substrates are present in the same chamber during the growth of layers on each.

Other possible solutions to the general problems outlined above include the use of various pushrods/bellow arrangements for manipulating wafers within the ultra-high vacuum chamber. Usually these manipulative devices are capable of handling only a single wafer at a time and are quite complex in that they are often magnetically controlled, i.e. controlled by use of a movable magnet which is external to the ultra-high vacuum chamber. As one can anticipate, such mechanisms are quite inaccurate, as well as frustrating and time consuming in the manipulation of a plurality of wafers.

While the apparatus described above has certainly advanced the MBE closer to a commercial system, problems nevertheless are compounded thereby. One such problem is, as mentioned above, the cross-contamination among workpieces within the growth chamber. Another problem is that since all of the substrates are present in the growth chamber, the number of substrates able to be processed at one time is limited by the size of the growth chamber itself. Another difficulty lies in the fact that protective apparatus must be included in the growth chamber to prevent and reduce the cross-contamination. This significantly increases the cost of such a growth chamber.

SUMMARY OF THE INVENTION

Accordingly, it is one object of the present invention to provide a sample transport system wherein a plurality of workpieces are provided to the ultra-high vacuum apparatus, but which system, nevertheless, permits the individual sample processing in the growth chamber without any cross-contamination.

This object is accomplished, at least in part, by providing a transport system having means for supporting and storing a plurality of workpieces in a first chamber and means adapted for removing a preselected workpiece from the supporting means and conveying only that workpiece to the growth chamber.

Other objects and advantages will become apparent from the following detailed description of an embodiment and the accompanying drawing.

BRIEF DESCRIPTION OF THE DRAWING

The drawing, which is not drawn to scale, comprises the following:

FIG. 1 is a schematic representation of a system embodying the principles of the present invention;

FIG. 2 is a sectional view of a sample carrier;

FIG. 5 depicts an elevator mechanism useful in the system shown in FIG. 1; and

FIGS. 6A-6D are perspective views of various portions of a conveyance means adapted for use in the system shown in FIG. 1.

DETAILED DESCRIPTION OF THE INVENTION

Figure 3:
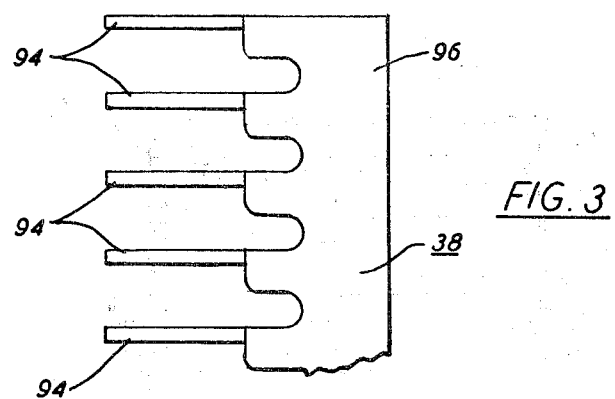
FIG. 3 is a partial sectional view of a sample cartridge designed according to the principles of the present invention.

A sample transport system including an ultra-high vacuum apparatus, generally indicated at 10 in FIG. 1, and embodying the principles of the present invention includes at least one sample introduction chamber 12, a sample storage chamber 14 axially aligned with the sample introduction chamber 12, a main transport chamber 16 and a processing, or growth, chamber 18.

The sample introduction chamber 12 is, in this embodiment, a hollow cylindrical member 20 having a vacuum sealable access port 22 at one end 24 thereof and being rigidly affixed to, and in communication with, the main transport chamber 16 at the other end 26 thereof. It is contemplated that, in one embodiment of the present apparatus, a plurality of introduction chambers 12 can be spaced along the main transport chamber 16. Preferably, the communication between the member 20 and the chamber 16 is selectively controlled via any means known in the art. In one embodiment, the selective means is a conventional vacuum gate valve 28 positioned near the other end 26 of the member 20. Although the axis 30 of the sample introduction chamber 12 can be oriented at various angles with the axis 32 of the main transport chamber 16, it is preferred that the axes, 30 and 32, be perpendicular to each other. Thus, for reference and exemplary purposes only, throughout the specification the sample introduction chamber 12 and movement therealong will be considered vertical, whereas the main transport chamber 16 and movement therealong will be considered horizontal. The member 20 can be fabricated from a stainless steel cylinder using well known manufacturing techniques.

The sample storage chamber 14 preferably includes a second stainless steel hollow cylindrical member 34 having an axis 36, which axis 36 is aligned with the axis 30 of the hollow cylindrical member 20. Preferably, the bores of the chambers 12 and 14 are cooperatively sized so that a sample cartridge 38, more fully described below, can traverse from one chamber, e.g. the sample introduction chamber 12, into the other chamber, e.g. the sample storage chamber 14 and vice versa. In addition, the sample storage chamber 14 includes an elevator means 40 adapted to control the displacement of a fixture 42, which fixture 42, discussed in detail below, is designed to interface with and transport the sample cartridge 38 from the introduction chamber 12 to the storage chamber 14.

The main transport chamber 16 can also be comprised of a third hollow stainless steel cylindrical member 44. The member 44 preferably includes a vacuum sealing cover 46 at one end 48 thereof and is sealingly affixed to, and in communication with, the processing chamber 18 at the other end 50 thereof. In the preferred embodiment, communication between the main transport chamber 16 and the processing chamber 18 is selectively controllable via a conventional vacuum gate valve member 52.

In the following general description of the operation of the apparatus 10 which follows, the system is deemed to be a molecular beam epitaxy instrument. After an appropriate start-up procedure is completed, the apparatus 10, including the processing chamber 18, is isolated from the remainder of the chambers and placed under an ultra-high vacuum, i.e. about $10^{-10}$ torr. The start-up procedure includes, among other steps, a requisite warm-up period for the conventional electronics and associated equipment, a calibration program which ensures that the various components of the apparatus 10 are in an operational condition and, if the apparatus 10 is controlled by a computer mechanism, a programming procedure to supply the apparatus 10 with the proper operating instructions. During this start-up procedure, the vacuum gate valve member 52 between the main transport chamber 16 and the processing chamber 18 is closed to prevent ambient communication therebetween and to maintain the processing chamber 18 in its ultra-high vacuum condition.

A plurality of semiconductor wafers are prepared and secured to carriers which are then inserted into the sample cartridge 38. In the preferred embodiment, the cartridge 38, more fully discussed below in conjunction with FIG. 2, is designed so that the wafers are vertically stacked. This is quite a radical departure from conventional means, which array the wafers in a single horizontal plane on a turntable or the like. The cartridge 38 is then inserted into the sample introduction chamber 14 and sealed therein by closure of the access port 22. The ambient within the sample introduction chamber 12 is isolated from the remainder of the apparatus 10 by closing the vacuum gate valve 28 prior to inserting the cartridge 38. It should be recognized that the various gate valves and motors, i.e. vacuum pumps or the like, utilized with the apparatus 10, can be either manually or automatically controlled.

Once the access port 22 of the sample introduction chamber 12 is sealed, the ambient pressure therein is reduced to about $10^{-8}$ torr by a vacuum means 54. The vacuum means 54 includes a vacuum pump 56 and a vacuum conduit 58, which conduit 58 communicates between the pump 56 and the sample introduction chamber 12 via an aperture 60 through the wall 62 of the member 20. The communication between the pump 56 and the introduction chamber 12 is selectively controlled via a vacuum gate valve 64 positioned near the wall 62 of the chamber 12. As the volume of the sample introduction chamber 12 is relatively small compared to that of the processing chamber 18, the desired vacuum is achieved in a relatively short period of time. When the desired vacuum has been achieved within the sample introduction chamber 12, the vacuum gate valve 28 is opened to effect ambient communication between the sample introduction chamber 12 and the main transport chamber 16.

The sample cartridge 38 is next removed from the sample introduction chamber 12 by first extending the elevator means 40 such that the fixture 42 carried thereby engages an interlock assembly upon which the cartridge 38 rests and secondly withdrawing the elevator means 40 to convey the cartridge 38 out of the introduction chamber 12. The elevator means 40 is preferably controlled by a drive motor 66, which is external to the member 34 and interfaces with the means 40 via a feedthrough device 68 and a gear train 70. The elevator means 40 and the sample storage chamber 14 are cooperatively designed so that when the fixture 42 is fully withdrawn, the cartridge 38 fully lies within the second hollow cylindrical member 34. Preferably, the vacuum gate valve 28 is reclosed to again isolate the ambient of the introduction chamber 12 from the remainder of the apparatus 10. Due to inherent characteristics of ultra-high vacuum systems, the main transport chamber 16 is somewhat contaminated and some vacuum is lost when the vacuum gate valve 28 is opened for the conveyance of the cartridge 38 to the storage chamber 14. Thus, it is quite desirable to reestablish the desired ultra-high vacuum within the main transport chamber 16. This is, in the preferred embodiment, accomplished by opening a vacuum gate valve 72 to permit communication between a vacuum pump 73, or alternatively, the vacuum pump 56, and the main transport chamber 16. Upon reestablishment of the desired vacuum in the main transport chamber 16, the vacuum gate valve 72 is maintained open so that the main transport chamber 16 remains at the desired vacuum.

The wafers can now be individually conveyed to the processing chamber 18 in any desired sequence or succession of sequences. In general, the selected wafer is removed from the cartridge 38 and, after the opening of the vacuum gate valve 52, placed on a conventional processing pedestal within the processing chamber 18 by a means 74 for conveying wafers. The means 74 for conveying wafers is then withdrawn from the processing chamber 18, and the vacuum gate valve member 52 is closed. Thereafter, the wafer can be processed in a conventional fashion. Consequently, the wafers not being processed are completely isolated from the processing chamber 18 and suffer no deleterious effects therefrom. In one embodiment, the means 74 includes a trolley 76 having a cantilever arm 78 extending therefrom. A wafer gripping means 80 is affixed to the cantilever arm 78 for retaining the wafer. The wafer selection is accomplished by extending or withdrawing the cartridge 38 into the main transport chamber 16 via the elevator means 40. Thus, the selected wafer is first moved into the plane of the wafer gripping means 80, whereafter the conveying means 74 transports the wafer to the processing chamber 18. After the processing of a selected wafer is complete, the wafer conveying means 74 removes it from the processing chamber 18, replaces it in the cartridge 38 and removes the next selected wafer from the cartridge for delivery to the processing chamber 18.

Upon completion of all the processing of all the wafers, the vacuum gate valve 52 is closed, the vacuum gate valve 28 is opened and the cartridge 38 is returned to the sample introduction chamber 12. After the fixture 42 is withdrawn from the cartridge 38 via the elevator means 40, the vacuum gate valve 28 is closed whereby the ambient of the sample introduction chamber 12 is again isolated from the main transport chamber 16. Thus, upon pressure equalization, the access port 22 can be opened for the removal of one sample cartridge 38 and the insertion of another sample cartridge without breaking the ultra-high vacuum within the processing chamber 18.

Referring particularly to FIG. 2 of the drawing, a sample carrier 82 is shown therein including an upper portion 84 having a relatively larger diameter and a lower portion 86 having a relatively smaller diameter. A shoulder 88 is formed at the intersection of the upper portion 84 and the lower portion 86. In addition, the upper portion 84 includes a major surface 90 opposing the lower portion 86 upon which a semiconductor wafer 92 can be rigidly affixed.

In practice, each carrier 82 has a semiconductor wafer 92 rigidly affixed to the major surface 90 thereof, after which the carrier 82 can be placed in the sample cartridge 38. As shown in FIG. 3, the cartridge 38 includes a plurality of spaced apart shelves 94 secured in position by a rigid spine member 96. Preferably, the shelves 94 are parallel to each other and vertically spaced such that a sample carrier 82 with a wafer 92 affixed thereto can be placed on each shelf 94. Further, as more fully discussed below, the spacing between shelves 94 should be such as to permit a slight "jogging" on the cartridge 38 during removal or replacement of a carrier 82 within the main transport chamber 16.

Upon inserting the sample cartridge 38 into the sample introduction chamber 12, the bottom of the sample cartridge 38 rests upon a platform assembly 98. Such an assembly 98 is clearly shown in FIGS. 4A-4D. Referring now to FIG. 4, it will be observed that, in the preferred embodiment, the sample cartridge 38 includes a recessed shelf 100 within an aperture 102 on the bottom 104 side thereof. As more fully discussed below, the recessed shelf 100 is primarily utilized for interfacing with the platform assembly 98, upon which the cartridge 38 rests.

Figure 4A:
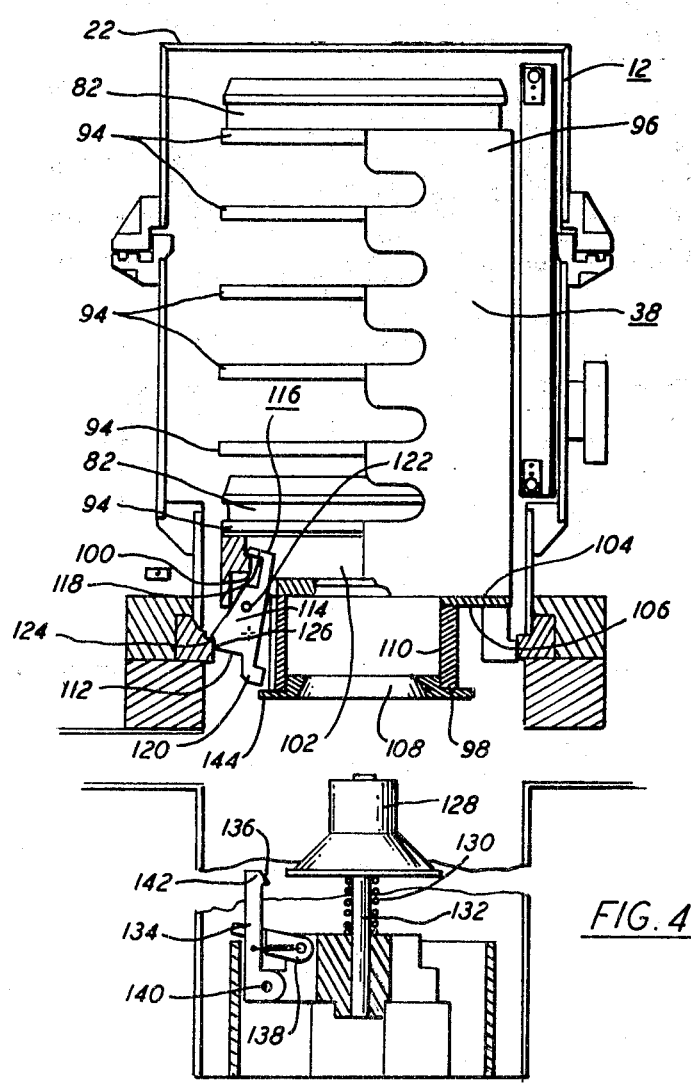
FIGS. 4A-4D depict the mating between the sample holder and the elevator.
Figure 4B:
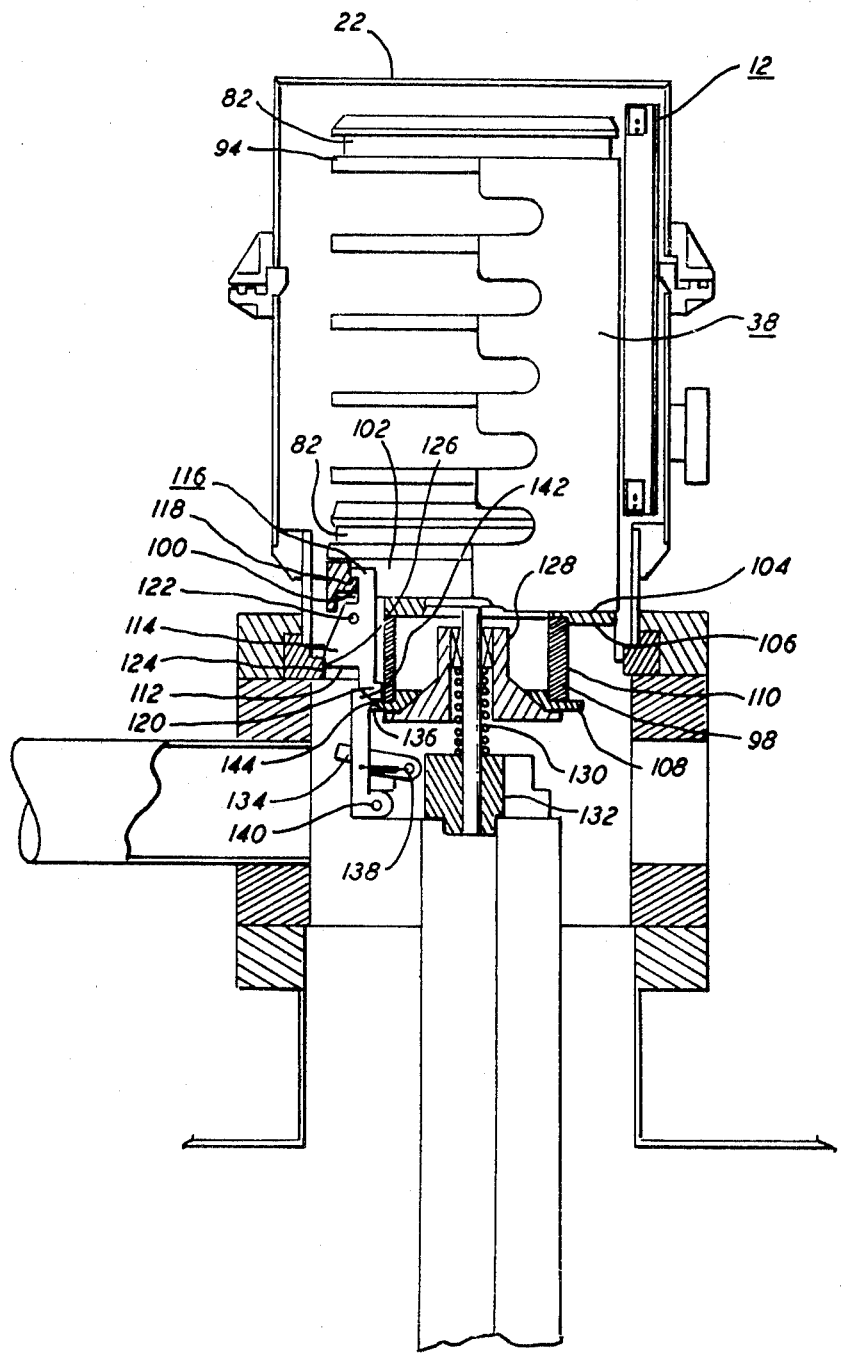

As shown, the platform assembly 98 includes a cartridge receiving surface 106 and a cone receiving aperture 108 opposing that cartridge receiving surface 106. The cone receiving aperture 108 and the wall 110 there-surrounding has a comparatively smaller diameter than the platform assembly surface 106. In the interstitial gap 112 between the introductory chamber 12 and the wall 110 surrounding the aperture 108 of the platform assembly 98, the assembly 98 carries therewith a first pawl 114 having at one end 116 a latch hook 118 adapted to close on the recessed shelf 100 within the bottom 104 of the sample cartridge 38. The first pawl 114 also includes a second latch hook 120 designed to act as a pivot stop for the first pawl 114. As shown in FIG. 4A, the first pawl 114 is attached to the platform assembly 98 via a pivot pin 122 about which the pawl 114 rotates. In general, the first pawl 114 has the general configuration of a reversed 'S'. Further, the introductory chamber 12 is arranged so that in an initial position, the first latch hook 118 of the pawl 114 is spaced apart from the internal recessed shelf 100 in the bottom 104 of the sample cartridge 38 by means of a ledge 124, which ledge 124 interconnects and locks open the pawl 114 via a notch 126 therein. Thus, when the sample cartridge 38 is inserted and contacts the platform assembly surface 106, the first pawl 114 extends within the aperture 102 and does not contact the sample cartridge 38.

In the preferred embodiment, the fixture 42 of the elevator means 40 includes a spring biased cone 128, which cone 128 is adapted to interface with the cone-shaped aperture 102 of the assembly platform 98. The cone 128 is preferably biased by a coil spring 130 positioned about a shaft 132 rigidly affixed to the fixture 42. The cone 128 is cooperatively arranged so that it is biased away from the remainder of the fixture 42. Additionally, the fixture 42 carries therewith a second pawl 134 having a latch hook 136 and a pawl locking mechanism 138 associated therewith, which locking mechanism 138 is more fully described below.

Figure 4C:
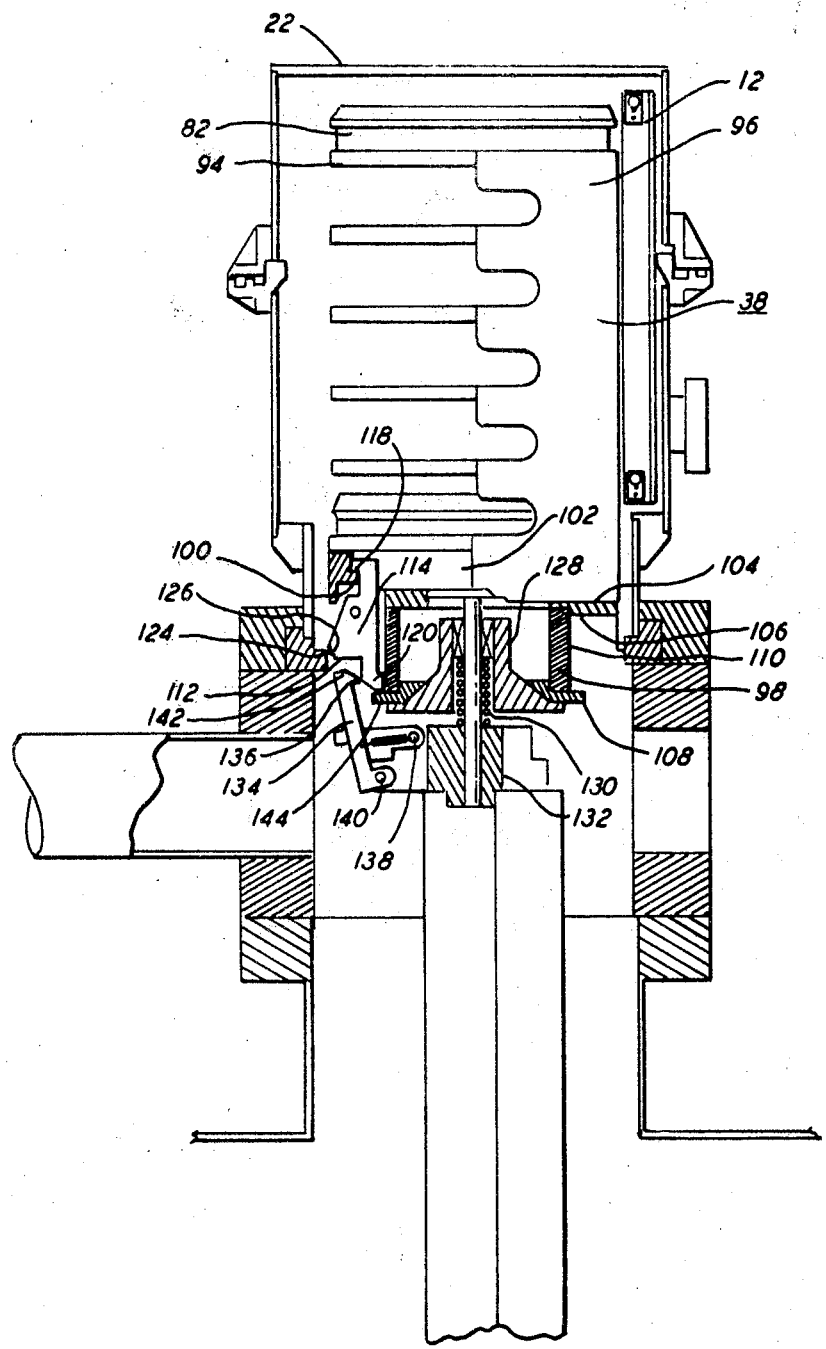
Figure 4D:
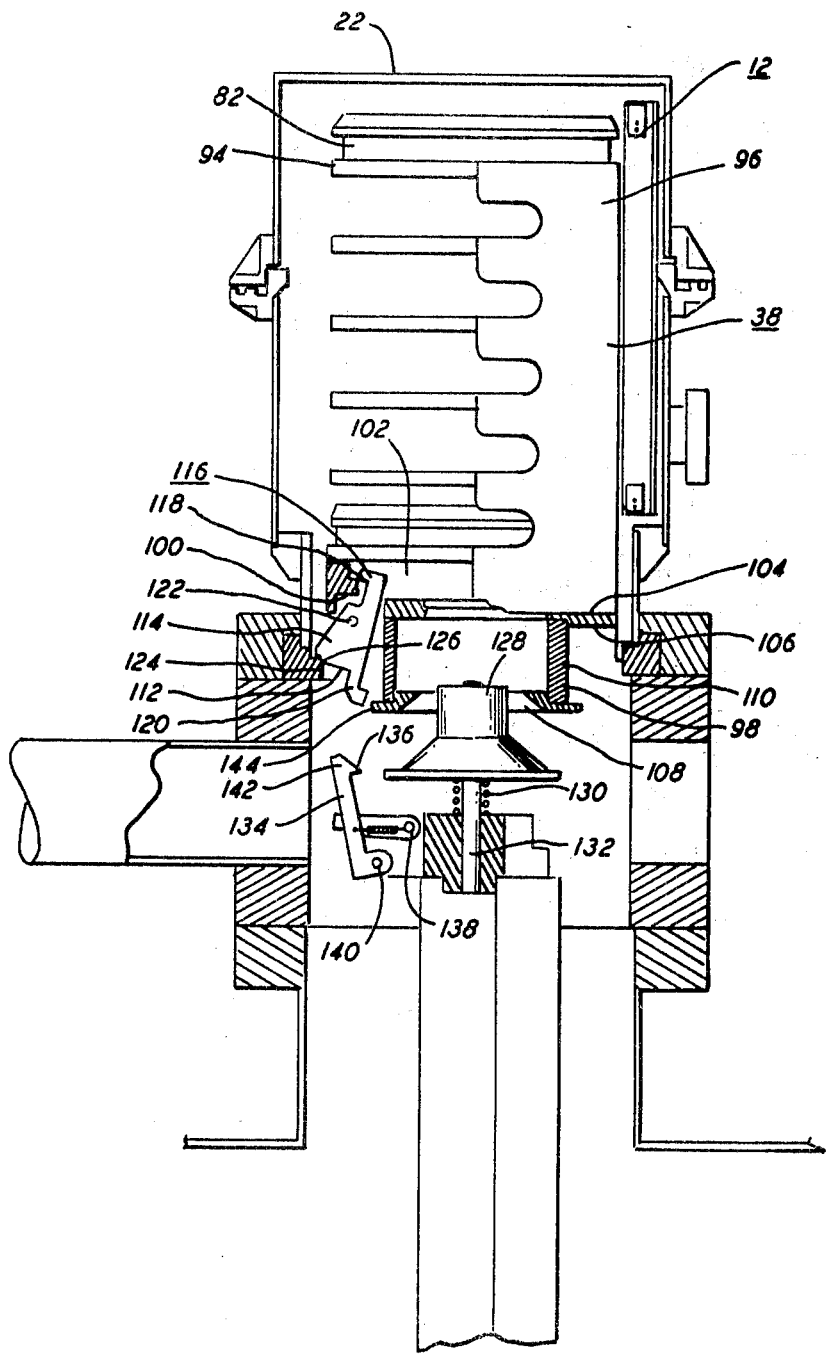

Referring now particularly to FIG. 4A, there is shown the various interlocking components in an initialization position, i.e. where a sample cartridge 38 has been introduced into the sample introductory chamber 12 and the first pawl 114 is fully rotated inwardly in a first position, the elevator means 40 is in a reset position, whereas the second pawl 134 is substantially vertical and free to pivot outwardly about a pivot pin 140. Upon the continued vertical travel of the elevator means 40, the spring biased cone 128 interfaces with the cone aperture 108 of the platform assembly 98. During this urging, the first pawl 114 is released from the ledge 124 and thus permitted to rotate outwardly to a second position, whereby the assembly 98 is latched onto the recessed shelf 100 of the cartridge 38. Substantially simultaneously during this movement, the second pawl 134, due to the presence of a bevelled leading surface 142, at its leading edge, is rotated outwardly and allowed to fall back to a first lock position. In this position, the latch hook 136 of the second pawl 134 overlies a rim 144 extending about the cone receiving aperture 108. In this position, i.e. the latched position, clearly shown in FIG. 4B, the fixture 42 is latched onto the platform assembly 98 which, in turn, is latched onto the sample cartridge 38. The connection between the fixture 42 and the platform assembly 98 is maintained via the bias of the spring 130, which counterpressures the surface interlock between the second pawl 134 and the rim 144 when the fixture 42 is withdrawn. By activating the elevator means 40, the sample cartridge 38 can now be withdrawn from the sample introduction chamber 12, after which the first vacuum gate valve 28 is closed. Upon completion of the processing of all of the wafers within the cartridge 38, the sample cartridge 38 is returned to the sample introductory chamber 12. With specific reference to FIG. 4C, that return step is shown. In FIG. 4C, the elevator means 40 carrying the fixture 42 is advanced vertically until the sample cartridge 38 is within the introductory chamber 12. Upon further advancement, the second pawl 134 is released from the rim 144 surrounding the cone receiving aperture 108 and locked in that extended rotating position by the key-shaped lock mechanism 138. Substantially simultaneously, upon further advancing the elevator means 40, the first pawl 114 is rotated back to its first position whereby the notch 126 contacts the locking ledge 124 within the introductory chamber 12, thereby releasing the sample cartridge 38 from the platform assembly 98. The final position, upon the withdrawal of the elevator means 40, is shown in FIG. 4D. The major difference between FIG. 4A and FIG. 4D is that while the cartridge 38 and platform assembly 98 are freed of each other, the second pawl 134 is in a second position fully rotated away from the fixture 42 and locked in place by the key assembly 138. Referring momentarily to FIG. 5, a key lock release extension 146 is shown substantially near the bottom 148 of the elevator shaft 150, which, upon withdrawal of the fixture 42, is positioned to contact the extended portion of the key latch 138 and, upon further withdrawal, rotate that latch vertically. Upon release, the second pawl 134 rotates from its position shown in FIG. 4D to its position shown in FIG. 4A. This rotation can be accomplished by mechanical means known in the art, for example, by a coil spring arrangement.

Although FIG. 4 shows only a single set of first and second pawls 114 and 134, respectively, it will be readily understood from the description herein that it is preferable to include a plurality of such pawls around the circumference of the platform assembly 38 and fixture 42. Such an arrangement can be carried out most easily with three sets of pawls distributed on angles of about 120°. Such a three point structure avoids jamming of the cartridge 38 during its traversal, either in the introductory chamber 12 or in the elevator shaft 150.

The elevator means 40, more specifically shown in FIG. 5, includes a drive motor 152 which is connected to a gear train 154 via a rotary shaft feedthru 156. Such a rotary shaft feedthru 156 is known in the art and, by the use of such a rotary feedthru 156, the need for providing linear motion across the chamber into the vacuum is avoided. As well known in the art, linear motion within an ultra-high vacuum chamber is quite difficult. Ordinarily, linear motion is achieved by use of a bellows, usually of considerable length. The difficulty with such bellows, of course, is that it is difficult to obtain smooth and/or accurate linear motion therefrom, particularly if such a bellows is quite long.

Again referring to FIG. 5, there is shown a gear train 154 which contacts and thereby rotates an interior elevator column 158 to which the fixture 42 interfaces. Thus, upon rotation of the motor 152, the fixture 42 can be moved in a linear direction, i.e. vertically.

In an alternative embodiment or as an included feature in the present embodiment, it is occassionally desirable to further ensure alignment between the fixture 42 and the assembly platform 98. This can be accomplished by introducing a small degree of flexibility along the column 158 itself. Such a degree of flexibility can be insured by a short flexible coupling means 164 either along the column 158 itself or external to the elevator shaft 150. Thus, the elevator shaft 150 can be tipped angularly a very small degree to ensure precise alignment of the fixture 42 with the cone receiving aperture 108 in the assembly platform 98.

Figure 6C:
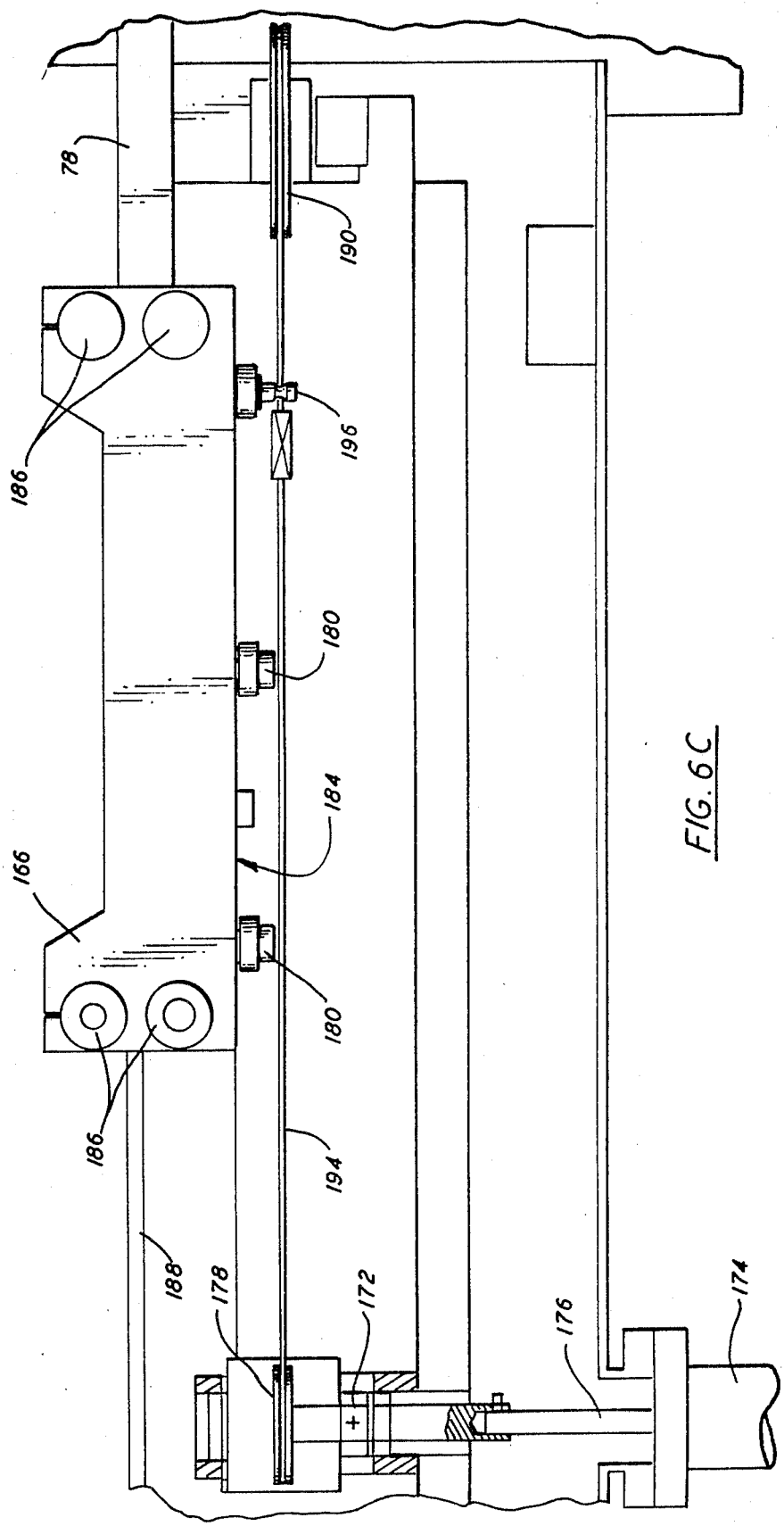

Referring now to FIGS. 6A–6D, the preferred embodiment for the conveying means 74 is described in further detail. In the preferred embodiment, the trolley mechanism 76 includes a frame member 166 having the cantilever arm 78 extending therefrom to which is attached a wafer support means 80, which means 80 is preferably a tong-shaped fixture 168 designed to cooperatively interact with the sample carrier 82. Specifically, as shown in FIG. 6A, the fixture 168 includes tongs 170 designed to extend around the lower portion 86. The tongs 170 are adapted to retain that preselected substrate carrier 82 via pressure between the shoulder 88 thereof and the surface 172 of the tongs 170. As shown in FIG. 6C, the conveying means 74 also includes a motor means 174 connected via a rotary feedthru mechanism 176 to at least one pulley 178 within the transport chamber 16. The trolley frame 166 includes at least one bearing 180 rotatably affixed thereto which guides the trolley 76 along a pair of first rails 182. The side plates 184 of the trolley 76 also include two pair of guide bearings 186 which extend on either side of a second guide track 188. Thus, by these guide and rail means, the movement of the trolley 76 is restricted to a single linear direction, and variation therefrom is minimized. The conveying means 74 also includes a pulley mechanism 190 including the drive pulley 178 affixed to the shaft 192 of the rotary feedthru 176 and through which a cable or wire 194 is threaded. In addition, there are pulleys rotatably mounted at each end of the transport chamber 16 for setting up a linear motion of the wire 194. The trolley 76 can be affixed for movement to the wire 194 by any means known in the art, including a crimped-on stud 196 protruding from a side plate 184 of the trolley 76. The particular and preferred arrangement of the guide rails 182 and 188 and pulleys 190 is more clearly shown in the end view of FIG. 6B.

As described above, upon the selection of a particular substrate to be processed, the elevator means 40 initiates movement in the sample cartridge 38 to align that particular substrate's sample carrier 82 into the same plane as the tongs 170. Naturally, the trolley 76 is withdrawn so that the necessary portion of the sample cartridge 38 can extend into the transport chamber 16. Once the alignment of the carrier 82 has taken place, the trolley 76 is moved to a position where the tongs 170 extend under the shoulder 88 of the carrier 82. The cartridge 38 is then, via a jogging movement of the elevator motor 152, freed from the cartridge 38 and, while in that position, the trolley 76 is withdrawn, carrying the selected substrate therewith. Once the trolley 76 has cleared the vertical line of movement of the cartridge 38, the cartridge 38 is withdrawn back into the elevator shaft 150 and the trolley 76 can then be moved toward the processing chamber 18. A pedestal, not shown, within the processing chamber 18 is adapted to receive the carrier 82 and is at substantially the same height as the tongs 170. Thus, the tongs 170 can, by a single linear movement, position the carrier 82 on the pedestal and, upon its withdrawal, leave the carrier 82 in a position to be processed. Upon withdrawal of the trolley 76, the vacuum gate valve 52 is then closed and the desired processing is carried out.

One major advantage of the above-described system is that, once positioned within the ultra-high vacuum, all movements of the substrates and cartridge 38 therein are linear. In addition, all linear movements are derived via rotary feedthru devices. Thus, there is no need for any bellows to introduce the desired linear motion, and further, no rotational movement within the apparatus 10 is necessary. As one can expect, any rotational movement, particularly if it is dependent upon external magnetic movement, would be extremely inaccurate and complex.

A further advantage is that by use of rotary feedthrus and drive motors affixed thereto, all movement and processing can, in fact, be fully and completely automated, whereby a plurality of wafers or substrates can be initially inserted by a technician and thereafter can be entirely processed without manual manipulation by any technician. Such an instrument undoubtedly will contribute to the commercial value of this invention, as it not only saves time and money, but also considerable amounts of manpower, and such lack of manpower can also improve accuracy of results.

Yet another advantage lies in the fact that the entire conveying means 74, including the trolley mechanism 76, can be assembled external of transport chamber 18. Specifically, it can be fabricated on an insertable bed, which is then slid into the transport chamber 18. Such a unique mechanism saves considerable time, money and effort in the internal design of any ultra-high vacuum transport chamber.

Although a single embodiment of the present invention has been described in considerable detail, it will be understood by those in the art that various alterations and modifications can be made without departing from the spirit and scope of the present invention. Thus, the present invention is deemed limited only by the claims appended hereto and the reasonable interpretation thereof.

What is claimed is:

1. A transport system useful for introducing and conveying a plurality of workpieces within an ultra-high vacuum apparatus, said system comprising:
    means for retaining a plurality of workpieces in a stacked spaced relationship;
    means for selectively positioning said retaining means within said apparatus;
    means for conveying a selected workpiece from said retaining means to a processing chamber; and
    means for interlocking said retaining means and said positioning means; said interlocking means including a platform assembly having a surface upon which said retaining means can be positioned;
    said interlocking means further including at least one pawl which, when said retaining means is positioned on said assembly surface, extends into a recess in the bottom of said retaining means and which, when said assembly is urged toward said retaining means, grasps an internally extending shelf within said recess.

2. A system as claimed in claim 1 further comprising:
    means for receiving said retaining means, said receiving means having means associated therewith for controlling the ambient therein.

3. A system as claimed in claim 2 wherein said controlling means includes a vacuum pump communicating with said receiving means via a selectively sealable conduit.

4. A system as claimed in claim 3 wherein said controlling means also includes a vacuum gate valve between said receiving means and the remainder of said apparatus.

5. A system as claimed in claim 3 or 4 wherein said receiving means includes a vacuum sealable access port through which said retaining means can enter or exit said receiving means.

6. A system as claimed in claim 1 wherein said retaining means is a plurality of shelf members spaced apart by a spine rigidly affixed to a base member.

7. A system as claimed in claim 1 wherein said positioning means is an elevator means having a fixture affixed thereto, said fixture being adapted to interlock with said base member of said retaining means.

8. A system as claimed in claim 1 wherein said conveying means is a trolley means having means for supporting one of said workpieces.

9. A system as claimed in claim 1 wherein said platform assembly includes a rim adapted for receiving means for grasping said positioning means.

10. A system as claimed in claim 9 wherein said positioning means includes means for grasping said rim.

11. A system as claimed in claim 10 wherein said grasping means is a pawl pivotably affixed to said positioning means.

12. A system as claimed in claim 1 or 7 wherein said positioning means having elevator means, said elevator means having a fixture affixed thereto said elevator being adapted to extend across the path of said conveying means.

13. A system as claimed in claim 12 wherein said positioning means being adapted to be retracted sufficiently to remove said retaining means from said path of said conveying means.

14. A system as claimed in claim 13 wherein said extending and said retracting motion of said elevator means is linear, and said linear motion is driven from a rotary feedthru driver.

15. A system as claimed in claim 1 wherein said conveying means traverses a transport chamber.

16. A system as claimed in claim 15 wherein said conveying means is mounted on an assembly, said assembly being insertable into said transport chamber.

17. A system as claimed in claim 16 wherein said assembly includes a trolley having a cantilever arm extending therefrom, one end of said cantilever arm being adapted to receive means for supporting a workpiece thereon.

18. A system as claimed in claim 17 wherein said trolley is conveyed within said transport chamber along guide rails.

19. A system as claimed in claim 18 wherein said trolley is affixed to a wire which is driven by pulleys, at least one of said pulleys being driven by a motor.

* * * * *